United States Patent [19]

Chao et al.

[11] Patent Number: 5,581,122
[45] Date of Patent: Dec. 3, 1996

[54] PACKAGING ASSEMBLY WITH CONSOLIDATED COMMON VOLTAGE CONNECTIONS FOR INTEGRATED CIRCUITS

[75] Inventors: Chien-Chi Chao, Taipei; Ming-Hane Lin, Chu-Pei; Ted C. Ho, Hsinchu, all of Taiwan

[73] Assignee: Industrial Technology Research Institute, Hsinchu, Taiwan

[21] Appl. No.: 328,734

[22] Filed: Oct. 25, 1994

[51] Int. Cl.⁶ .................................................... H01L 23/52
[52] U.S. Cl. ........................... 257/691; 257/700; 257/738
[58] Field of Search .................................... 257/691, 738, 257/700, 690, 698

[56] References Cited

U.S. PATENT DOCUMENTS

| | | | |
|---|---|---|---|
| 5,173,767 | 12/1992 | Lange et al. | 257/700 |
| 5,285,352 | 2/1994 | Pastore et al. | 257/700 |
| 5,402,318 | 3/1995 | Otsuka et al. | 257/691 |
| 5,442,230 | 8/1995 | Chillara et al. | 257/701 |

*Primary Examiner*—William Mintel
*Assistant Examiner*—Roy Potter
*Attorney, Agent, or Firm*—Bo-In Lin

[57] ABSTRACT

An IC dice mounted on a substrate carrier wherein the IC dice is connected by a plurality of bonding wires to a plurality of corresponding bonding pads on the substrate carrier. The wire bonding layout configuration of the electronic device is improved in the present invention by providing centralized consolidated common voltage pads or bars such that the electric wires connecting the bonding pads to external interface contact points, e.g., the ball grid array (BGA) may be shortened. Additionally, the access widow for wire bonding to the IC dice may be broadened.

10 Claims, 8 Drawing Sheets

PACKAGING ASSEMBLY WITH CONSOLIDATED COMMON VOLTAGE CONNECTIONS FOR INTEGRATED CIRCUITS

BACKGROUND OF THE INVENTION

1. Field of the Invention

This invention relates generally to the manufacture and packaging of semiconductor devices. More particularly, this invention relates to an improved ball grid array (BGA) layout and fabrication method for a semiconductor device package assembly including consolidated common voltage connections to reduce the length of wires for wire bonding, to allow higher number and higher density of pin-count, and to improve the manufacture yield rate thus reduce the manufacturing costs of the semiconductor devices.

2. Description of the Prior Art

As the integrated circuits (ICs) become ever smaller with higher circuit density while handling more complicate functions and processes, the level of technical complexity in packaging and connecting the IC devices on a printed circuit board by the use of electric wires also becomes a more difficult task. Specifically, with the increased number of wires connected to an IC device, the distance between these wires becomes smaller. Potential problem arises when there may be cross-coupling of the variations of the electric-magnetic fields in these wires as the distances between these wires become smaller. Furthermore, with limited surface areas available on an IC dice and on the printed circuit board surrounding the IC dice. It may often require the use of longer electric leads for establishing electric contact with either a ground voltage or other voltage sources and external circuits. The longer length of wires poses potential problems in manufacturing yield and long-term operational reliability.

A package for containing the high speed IC devices is disclosed in an U.S. Pat. No. 5,012,386 by McShane et al. entitled 'High Performance Overmolded Electronic Package'. The package has a multiple layers with a built-in cavity. The substrate has a plurality of holes penetrating these multiple layers for the leads to be placed therein for soldering or otherwise electrically connecting to conductive pattern or layers in the substrate. A thermally conductive insert is attached to one side of the substrate. The insert has a pedestal which protrudes through the cavity in the substrate. An electronic component, such as an IC may be mounted on the pedestal and electrically connected to a electrically conductive metal pattern on one of the layers of the substrate. The assembly may then be coated with dielectric material to form a package body. The package also has a thermal insert to aid in dissipating the heat. The package may also have a ground and power planes to provide consistent coplanar leads such that the surface mounting processes may be more uniformly performed.

Figure 1:
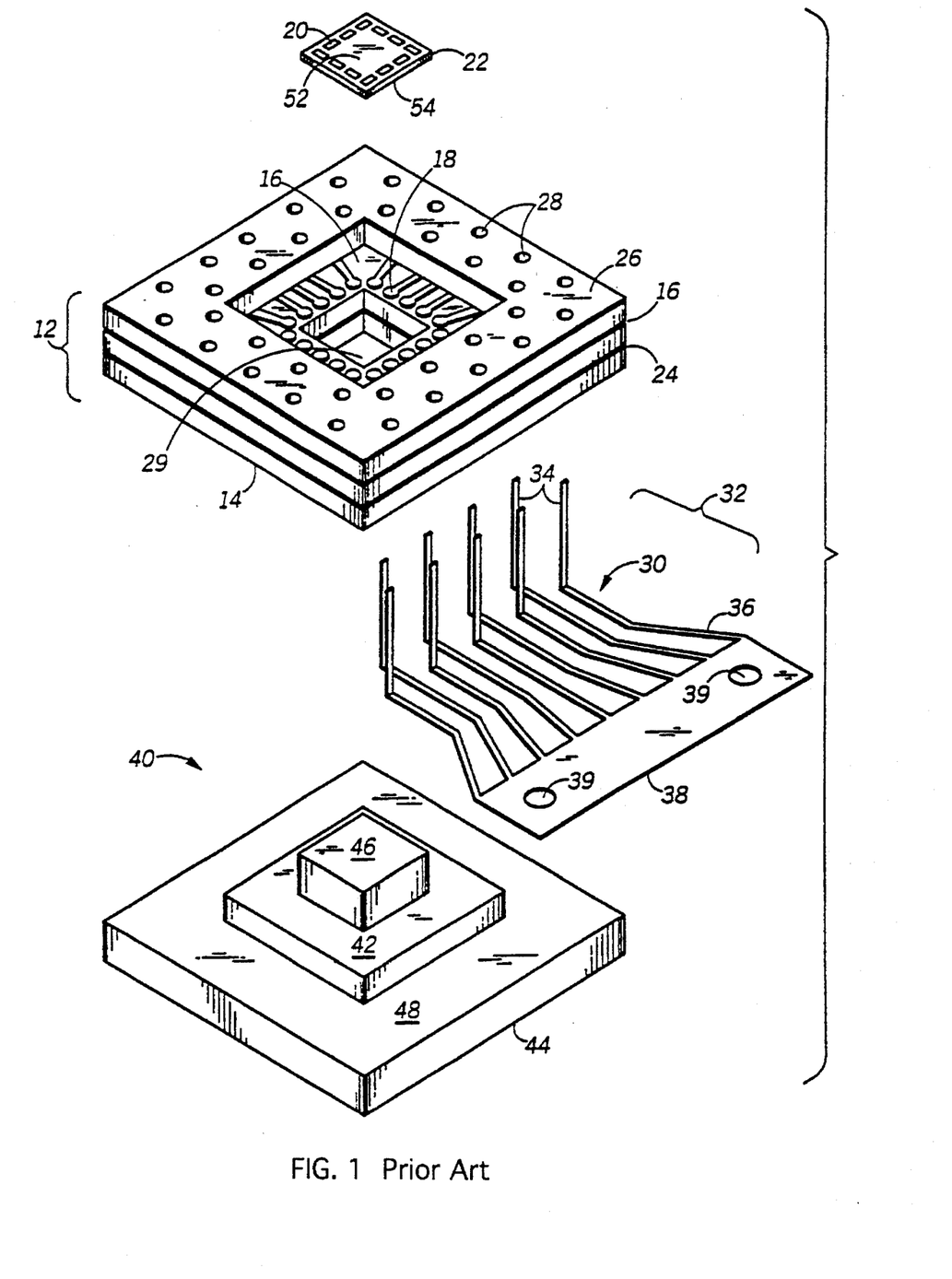
FIG. 1 is an exploded three quarter view of some of the components of a electronic package according to a prior art patent.

The package disclosed by McShane et al. provides good protection and enhanced thermal conductivity for the mounting of the electronic device. However, it does not provide a solution to the difficulty that the modern electronic IC devices often require more input, output, input/output (I/O) or other type of pin connections for external interface. The limitation encountered in the prior art can be clearly appreciated by referring to FIG. 1 which is originally included as FIG. 1 in the Patent by McShane et al. Thus the number of leads which need to be connected to the IC device is greatly increased with increased pin counts. Even that the substrate includes a ground or other power planes wherein each plane being set at a specific common voltage, no disclosure is made by McShane et al. to employ the planes of common voltage to solve the difficulty caused by the high density pin counts and the requirement of numerous leads for connection to the IC device.

Lin et al. disclose in another U.S. Pat. No. 5,216,278 entitled 'Semiconductor Device Having a Pad Array Carrier Package' (issued on Jun. 1, 1993) a semiconductor device mounted on a carrier substrate. The semiconductor device has a first and a second wiring layers on opposite surface of the carrier substrate interconnected through vias formed in the substrate carrier which provide electric coupling of the semiconductor device to an IC to a mounting substrate through compliant solder balls displaced away from the vias.

Figure 2:
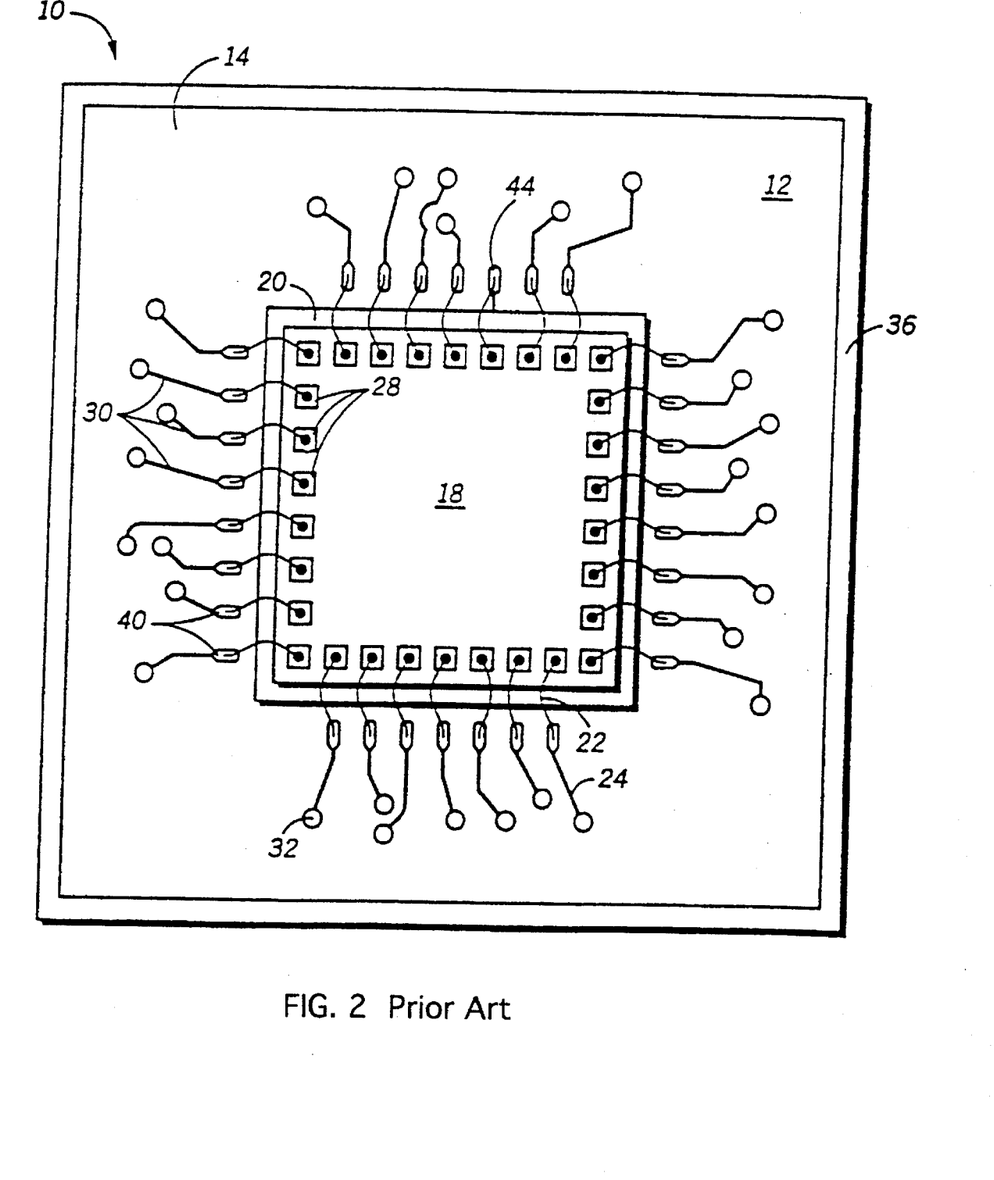
FIG. 2 is a top view of a semiconductor device formed on a carrier package with a pad array according to another prior art patent.
Figure 3:
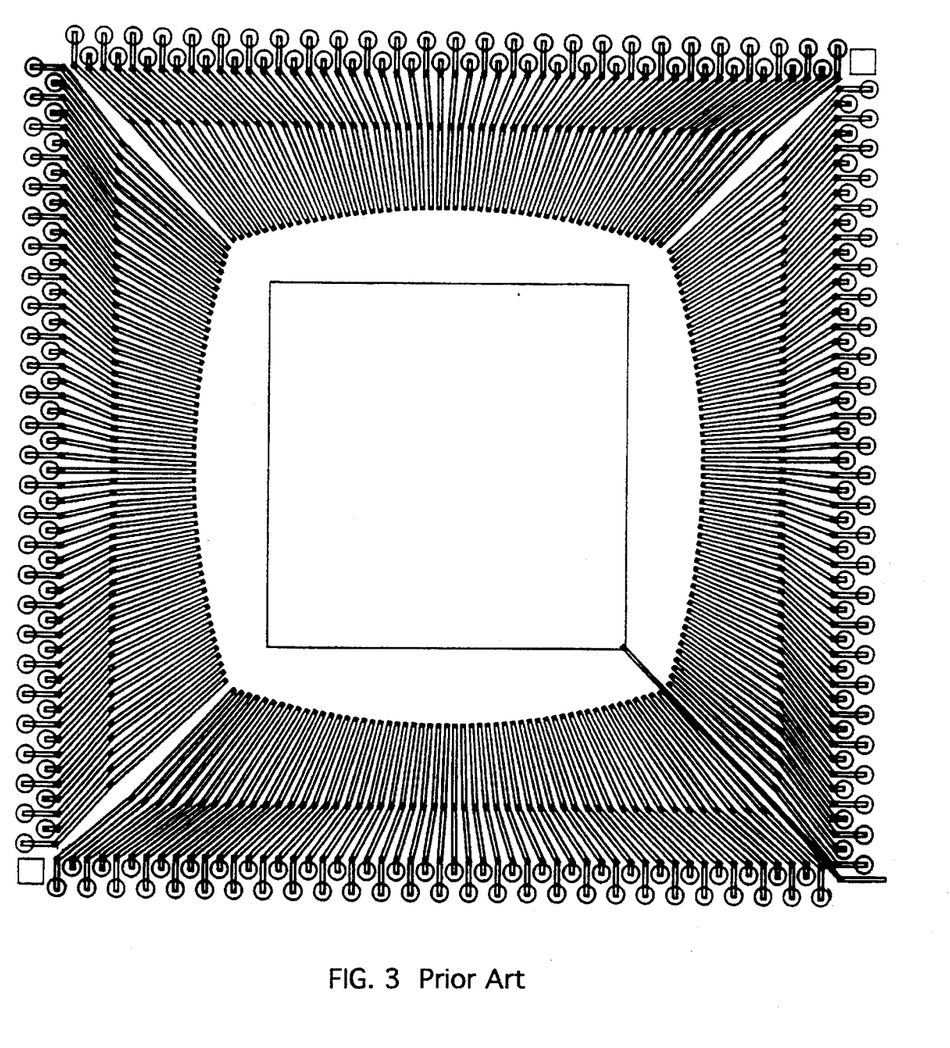
FIG. 3 is a top view of the wire connection layout for an IC device mounted on a carrier package with high density pin count according to a prior art design.

The substrate carrier as disclosed by Lin et al. can be made with standard size and provides good heat dissipation. The lead traces formed on independent wiring layers can improve the electrical performance. The electric traces with the specific layout may also be formed prior to the mounting of the electronic component thus reducing the manufacturing cost. However, the semiconductor device as disclosed by Lin et al. (see FIG. 2 from the Patent by Lin et al.) does not provide a electric wire layout to overcome the difficulty for a modern electronic component, e.g., an IC device, when the pin counts for external interfaces are increased thus causing a very high electric wiring density as that shown in FIG. 3. It can be appreciated by a brief comparison of the electric wiring arrangements between FIGS. 2 and 3 that as the pin counts and the density of electric wires increased, it is required to extend the length of the electric wires in order to properly separate the bonding pads on the substrate and the vias on the outer edges of the substrate. The extended length of the electric wires causes an increase in manufacturing cost not only more materials are required for longer wires, also the formation of elongated fine traces with very short distances between these wires reduced the yield rate of good products. The difficulty of making uniform long wires on the substrate also reduces the reliability of the semiconductor device where malfunction of the entire device may be caused by a failure of one of these wires.

Therefore, a need still exists in the art of semiconductor manufacture and packaging to provide a layout configuration and design method to overcome this problem. Specifically, this layout configuration for the electric wire connections must be able to reduce the required length of the leads while providing easy access for external interface, maintaining high level of packaging integrity and improving the manufacturing yield.

SUMMARY OF THE PRESENT INVENTION

It is therefore an object of the present invention to provide an IC wire bonding layout configuration for an IC packaging assembly including consolidated common voltage connections to overcome the aforementioned difficulties encountered in the prior art.

Specifically, it is an object of the present invention to provide an IC wire bonding layout configuration for an IC packaging assembly including consolidated common voltage connections by providing consolidated common voltage pads or bars such that the electric wires for external interface may be shortened.

Another object of the present invention is to provide an IC wire bonding layout configuration for an IC packaging assembly including consolidated common voltage connections by providing consolidated common voltage pads or bars such that the access window to the IC may be broadened.

Another object of the present invention is to provide an IC wire bonding layout configuration for an IC packaging assembly including consolidated common voltage connections by providing consolidated common voltage pads or bars such that the manufacturing yield may be improved.

Another object of the present invention is to provide an IC wire bonding layout configuration for an IC packaging assembly including consolidated common voltage connections by providing consolidated common voltage pads or bars such that reliability of the IC device may be improved.

Briefly, in a preferred embodiment, the present invention comprises an electronic device including an IC dice mounted on a substrate carrier wherein the IC dice is connected by a plurality of bonding wires to a plurality of corresponding bonding pads on the substrate carrier. The wire bonding layout configuration of the electronic device is improved in the present invention by providing centralized common voltage pads or bars such that the electric wires connecting the bonding pads to external interface contact points, e.g., the ball grid array (BGA) may be shortened. Additionally, the access widow for wire bonding to the IC dice may be broadened.

It is an advantage of the present invention that it provides an IC wire bonding layout configuration for an IC packaging assembly including consolidated common voltage connections by providing consolidated common voltage pads or bars such that the electric wires for external interface may be shortened.

Another advantage of the present invention is that it provides an IC wire bonding layout configuration for an IC packaging assembly including consolidated common voltage connections by providing consolidated common voltage pads or bars such that the access window to the IC may be broadened.

Another advantage of the present invention is that it provides an IC wire bonding layout configuration for an IC packaging assembly including consolidated common voltage connections by providing consolidated common voltage pads or bars such that the manufacturing yield may be improved.

Another advantage of the present invention is that it provides an IC wire bonding layout configuration for an IC packaging assembly including consolidated common voltage connections by providing consolidated common voltage pads or bars such that reliability of the IC device may be improved.

These and other objects and advantages of the present invention will no doubt become obvious to those of ordinary skill in the art after having read the following detailed description of the preferred embodiment which is illustrated in the various drawing figures.

DETAILED DESCRIPTION OF THE PREFERRED EMBODIMENT

Figure 4A:
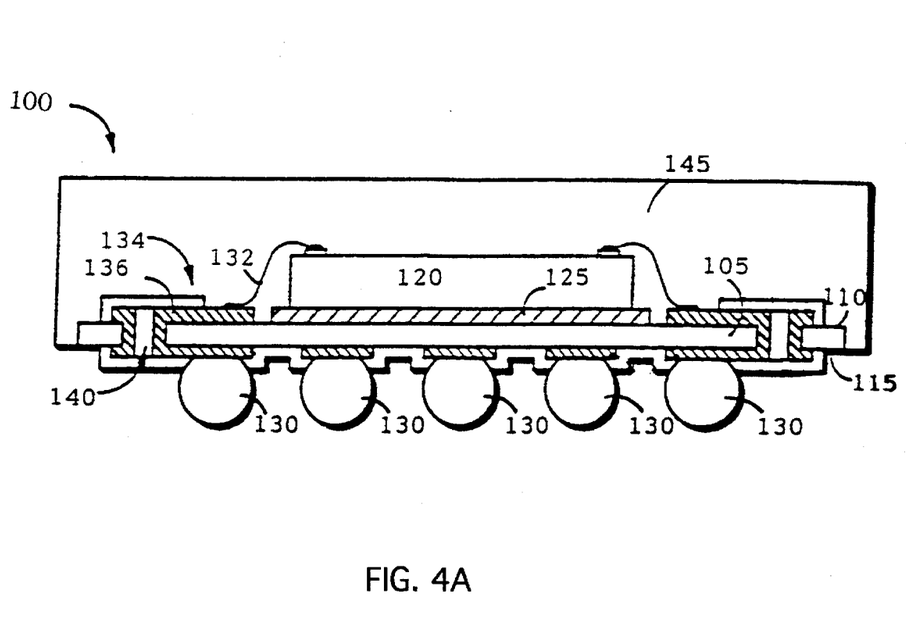
FIG. 4A is a cross-sectional view of a packaging assembly for an integrated circuit of the present invention.

FIG. 4A shows a cross sectional view of a voltage-consolidation integrated circuit (IC) packaging assembly 100 as one of the preferred embodiments of the present invention. The voltage consolidation IC packaging assembly 100 is formed on a carrier substrate 105 which includes an integrated circuit (IC) mounting surface 110 and a package supporting surface 115 which is the bottom surface of the carrier substrate 105 for supporting an integrated circuit (IC) electronic component 120 to be mounted on a die attachment surface 125. The die attachment surface is formed on a copper surface formed as a thin film on the top surface of substrate 105. The substrate 105 is preferably formed by the use of an insulative resin. The resin material is flexible, suitable for various thin film formation and etching processing, and has good heat dissipation characteristic. The IC electronic component 120 is to be electrically coupled to a plurality of solder balls 130 formed on the package supporting surface 115 through a plurality of bonding-wires 132 and package leads 134. Each of the boding wires is bonded to a bonding pad 136 on the IC electronic component 120 to electrically couple to the package leads 134. Each of the package leads 134 which include a plurality of conductive metal traces, leading to a plurality of vias 140 for electrically connected to the solder balls 130. For the protection of the IC electronic component 120 and the wires 132 and leads 134, a package coverall 145 may be used for covering and protecting the entire packaging assembly 100 by applying an over-molding technique.

Figure 4B:
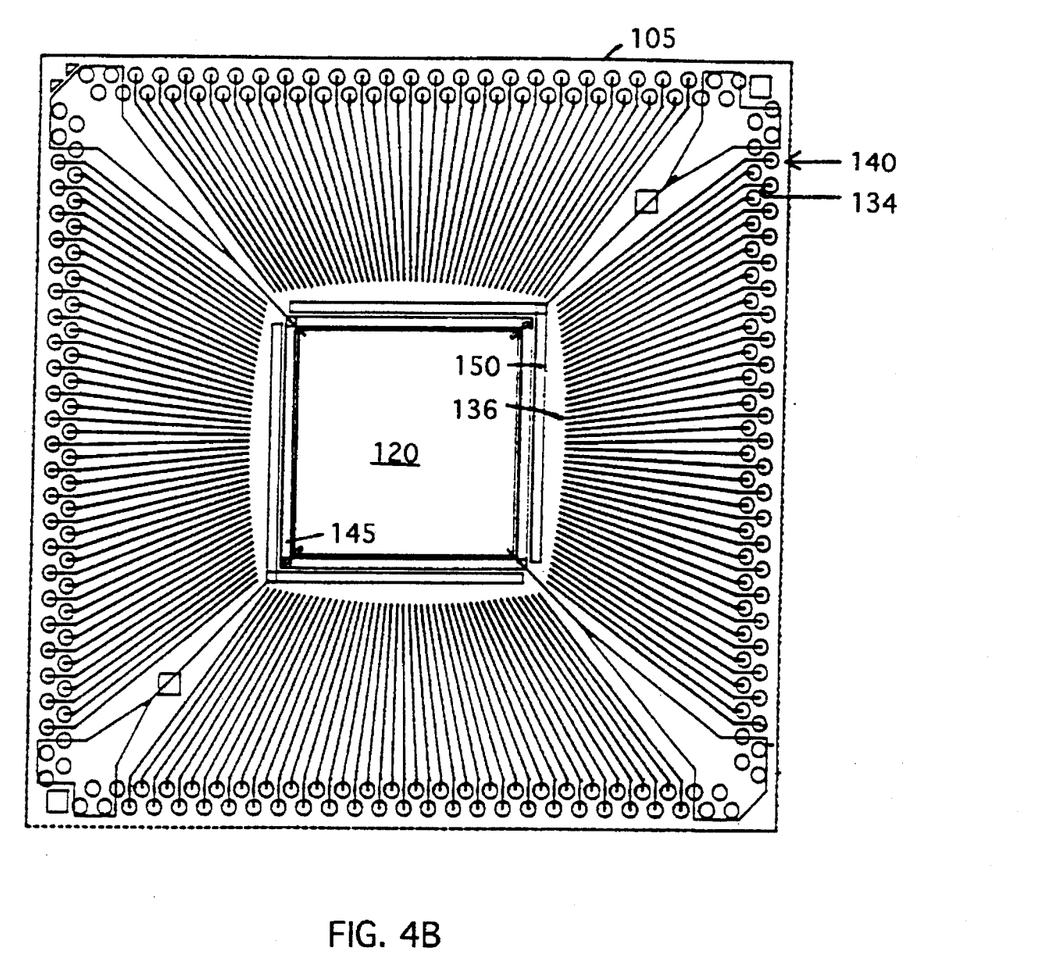
FIG. 4B is a top view of a packaging assembly for an integrated circuit of FIG. 4A.

Referring to FIGS. 4A and 4B now, the voltage-consolidation integrated circuit (IC) packaging assembly 100 also include a ground voltage-consolidation connection bar 145 and a Vcc voltage consolidation connection bar 150 disposed on the peripheral of the die attachment surface 125 and the IC electronic component 120. A consolidated ground connection bar 145 and a Vcc connection bar 150 are provided near the IC electronic component to shorten the distance of necessary wire boding required for connection to voltage of ground or Vcc. For a typical IC device on a 8 millimeters by 8 millimeters (8 mm by 8 mm) die having 220 input/output pads, the lengths of the wires for wire-bonding for the present invention with consolidated voltage connection bars, i.e., the ground bar 145 and Vcc bar, the are shortened from an average of about 180 mils for a conventional design to approximately 100 mils. The IC devices with shortened wires have several advantages. They are easier to manage in the wire-bonding fabrication processes and also less vulnerable to wire damages in subsequent manufacturing processes and in shipment and operation thus providing higher manufacture yield and improvement in operational reliability.

Figure 4C:
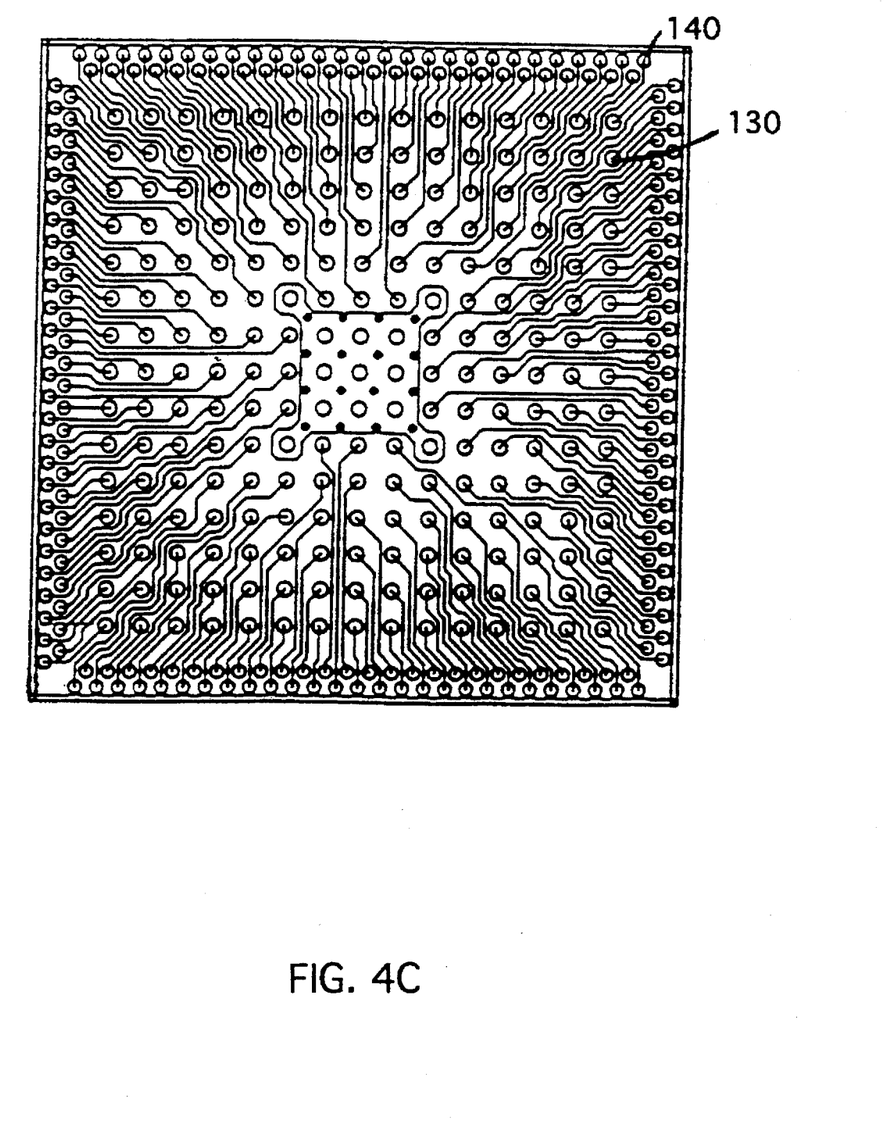
FIG. 4C is a bottom view of the carrier substrate showing the wire connection layout of the electronic device of FIG. 4A.
Figure 4D:
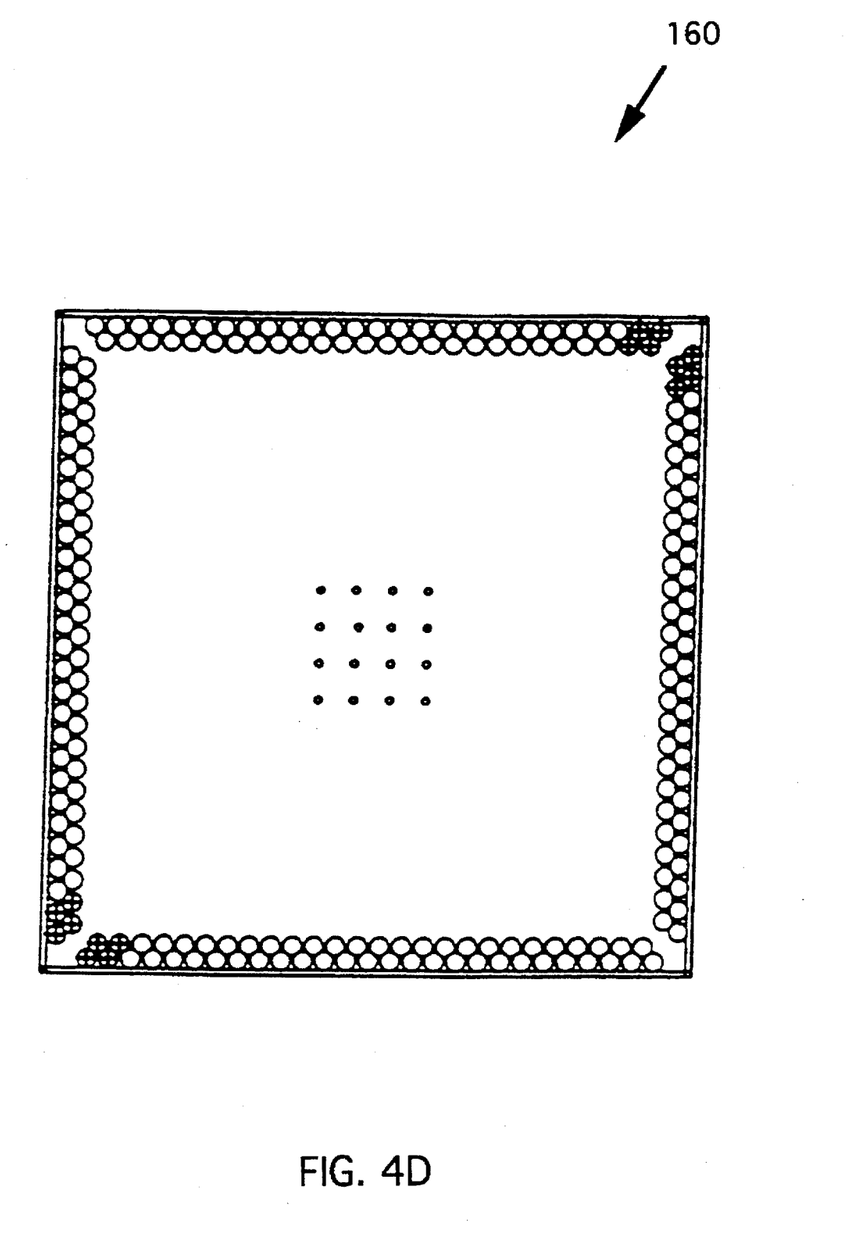
FIG. 4D is a top view of a common ground voltage layer for the packaging assembly for an IC device of FIG. 4A.
Figure 4E:
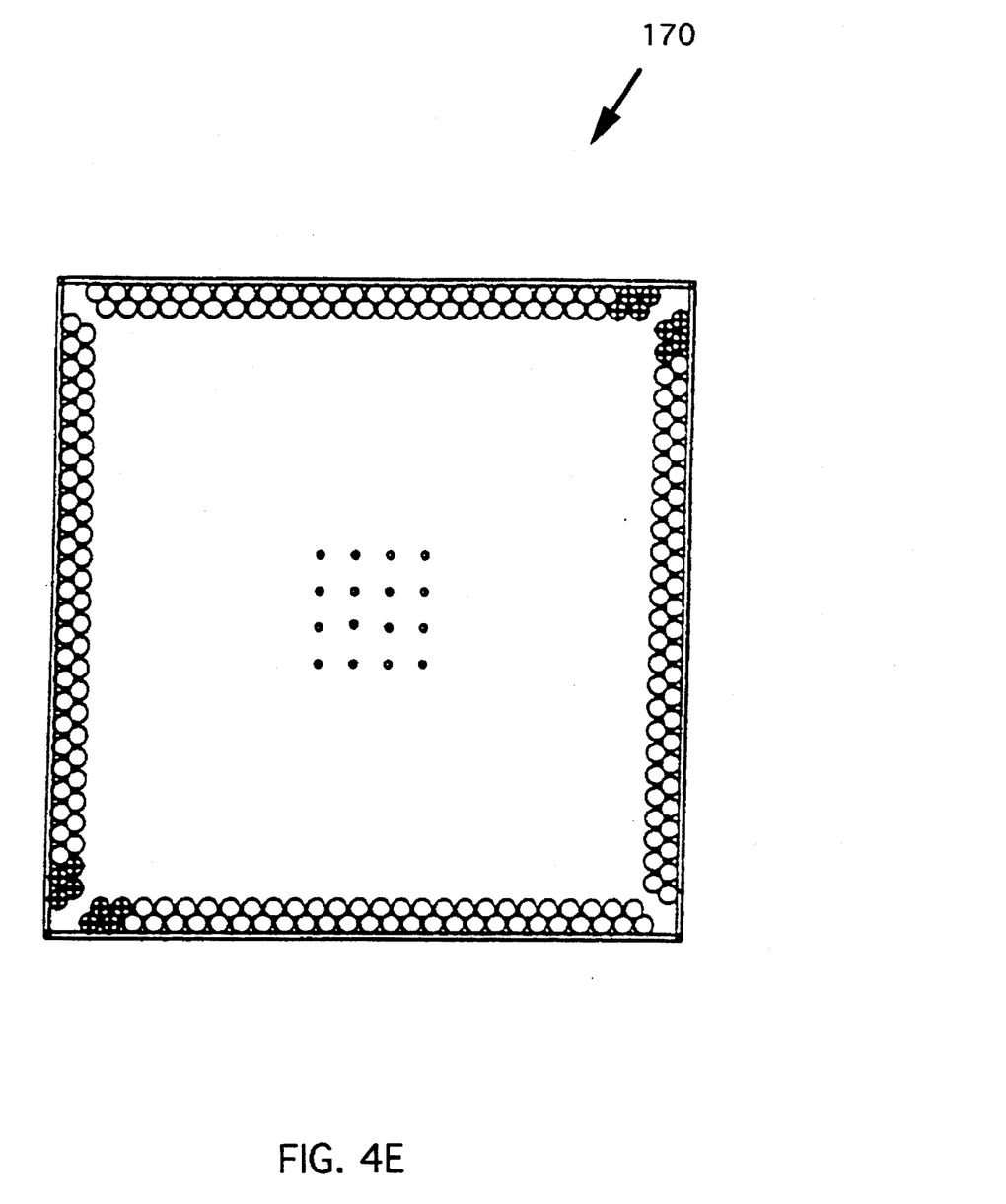
FIG. 4E is a top view of a Vcc common voltage layer for the packaging assembly for an IC device of FIG. 4A.

Referring to FIGS. 4D and 4E for another preferred embodiment of the present invention. FIG. 4C is the bottom view of a packaging assembly showing the wire connection layout of the electronic device. A top view of a ground voltage layer 160 and a Vcc voltage layer 170 are shown in FIG. 4D and FIG. 4E respectively which are disposed below the supporting surface 115 of the carrier substrate 105. A ground voltage and a Vcc voltage can be established for the electronic component 120 by connecting via a boding wire 132 to the consolidated ground connection bar 145 or the consolidate Vcc connection bar 150. Connections to the ground voltage layer 160 or the Vcc layer 170 can then be established by employing the package leads 134 and the wires through the vias 140. Small holes 175 are also provided in layers 160 and 170 for the purpose of heat dissipation.

The voltage-consolidation connection bars such as the consolidated ground voltage connection bar 145 and the consolidated Vcc voltage connection bar 150 thus provide convenient access means for connection to some common voltage without requiring longer bonding wires since these connection bar are formed near the electronic component 120. The density of wire distribution for the bonding wires 132 and package leads 134 can be reduced by the use of these voltage-consolidation connection bars 132 and 134. The number of pin counts for the electronic component 120 can also be increased because of this density reduction. The ground voltage layer 160 and the Vcc voltage layer 170 are also employed for the purpose of noise shielding such that the noises generated from interferences between adjacent wires are reduced thus improving the performance of the IC component 120 mounted on the die attachment surface 125.

In summary, an electronic device packaging assembly 100 formed on a carrier substrate 105 including a die attachment surface 125 for mounting and attaching said electronic device 120 thereon is disclosed. The assembly 100 includes a plurality of wire bonding pads 136 to be electrically connected to the electronic device 120 with boding wires 132. The packaging assembly 100 further includes a plurality of vias 140 disposed on and penetrating through the carrier substrate 105. The packaging assembly 100 further includes a plurality of package leads 134, each connected to one of the wire bonding pads 136 for connecting through the vias 140 to an external connection means 130 disposed on a second surface 115 on the carrier substrate 105 opposite the die attachment surface 125. The packaging assembly further includes a least one consolidated common voltage connection means 145 or 150 disposed near the die-attachment surface 125 to be electrically connected to the electronic device 120 with boding wires 132 for establishing a common voltage connection for the electronic device 120. In one of the preferred embodiments, the external connection means 130 disposed on the second surface 115 including a ball grid array formed by a plurality of solder balls 130. In another preferred embodiments, the packaging assembly further includes a low voltage layer 160 and a high voltage layer 170 for connecting to one of the consolidated common voltage connection means 145 or 150. In another preferred embodiments, the packaging assembly 100 further includes a low voltage layer 160 and a high voltage layer 170. The consolidated common voltage connection means including a consolidated low voltage connection means 145 for connecting to the low voltage layer 160 and a consolidated high voltage connection means 150 for connecting to the high voltage layer 170. In yet another preferred embodiment of the packaging assembly 100, the low voltage layer is a ground voltage layer 160, and the high voltage layer is a Vcc voltage layer 170.

The present invention also teaches a method for forming an electronic device packaging assembly 100 on a carrier substrate 105 which includes a die attachment surface 125 for mounting and attaching an electronic device 120 thereon. The method includes the steps of: (a) forming a plurality of wire bonding pads 136 on the substrate 105 to be electrically connected to the electronic device 120 with bonding wires 132; (b) forming a plurality of vias 140 penetrating through the carrier substrate 105; (c) forming a plurality of package leads 134, each connected to one of the wire bonding pads 136 for connecting through the vias 140 to an external connection means 130 disposed on a second surface on the carrier substrate 105 opposite the die attachment surface 125; and (d) forming a least one consolidated common voltage connection means 145 or 150 disposed near the die-attachment surface 125 to be electrically connected to the electronic device 120 with boding wires 132 for establishing a common voltage connection for the electronic device 120.

This invention also discloses an electronic device 100 includes an IC component 120 mounted on a die attachment surface 125 supported by a carrier substrate 105 in a packaging assembly 100. The electronic device 100 includes a plurality of wire bonding pads 136 formed on the carrier substrate 105 electrically connected to the IC component 120 with boding wires 132. The electronic device 100 further includes a plurality of vias 140 disposed on and penetrating through the carrier substrate 105. The electronic device 100 further includes a plurality of package leads 134 formed on the substrate carrier 105, each of these leads 134 connected to one of the wire bonding pads 136 for connecting through the vias 140 to an external connection means 130 disposed on a second surface on the carrier substrate 105 opposite the die attachment surface 125. The electronic device 100 further includes at least one consolidated common voltage connection means 145 or 150 disposed near the die-attachment surface 125 and electrically connected to the IC component 120 with boding wires 132 for establishing a common voltage connection for the IC component 120.

In a preferred embodiment, the voltage consolidation bars are formed by first depositing a conductive thin film, e.g., copper film, on top of the substrate 105. An etching process is then carried out to form a circuit pattern including the ground voltage consolidation bar 145, the Vcc voltage consolidation connection bar, the wire bonding pads 136 and the package leads 134. Preferably, the packaging material used for the assembly 100 including the materials used for the carrier substrate 105, the IC component 120 and the die attachment surface 125 are selected to have similar mechanical characteristics and coefficient of thermal expansion to increase the reliability of the IC packaging assembly 100. A preferred flexible material for construction of the carrier substrate 105 is a resin material commonly known under a trade name of BT, or a glass-epoxy circuit board material generally identified as generic grade FR-4, or other polymer materials, e.g., polymide. The solder balls 130 are generally formed by the use of lead-tin alloys having different lead-tin compositions ranging from 60:40 to 70:30, or other types of alloys including compositions of lead, tin and indium.

The present invention thus provides an IC wire bonding layout configuration for an IC packaging assembly which includes consolidated common voltage connections to overcome the difficulties encountered in the prior art. Specifically, the present invention provides an IC wire bonding layout configuration for an IC packaging assembly including consolidated common voltage connections such as the consolidated common voltage pads or bars such that the electric wires for external interface may be shortened. Furthermore, by providing consolidated common voltage pads or bars, the access window to the IC is also broadened. By using the techniques disclosed in the present invention, the manufacturing yield of the IC devices and the packaging assembly is also improved because of the broaden access window generated by the use of the consolidated common voltage connections. The reliability of the IC device is also improved with an IC wire bonding layout configuration for an IC packaging assembly including consolidated common voltage connections because of the shortening of the bonding wires which lessens the likelihood of wire breakdown when longer bonding wires are used.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

I claim:

1. An electronic device packaging assembly formed on a carrier substrate including a die attachment surface for mounting and attaching an electronic device thereon, said assembly comprising:

a plurality of wire bonding pads disposed on said die attachment surface to be electrically connected to said electronic device with a plurality of pad bonding wires;

at least one consolidated common voltage connection means disposed on said die-attachment surface, on a same surface as said wire bonding pads, provided for electrically connecting to said electronic device with a plurality of common voltage bonding wires for establishing a common voltage connection for said electronic device wherein said consolidated common voltage connection means being disposed on a same plane as said die attachment surface directly adjacent to and spaced from said electronic device whereby said common voltage bonding wires are shorter than said pad bonding wires and said common voltage connecting means is provided with a freedom for connecting to different levels of common voltages.

2. The electronic device packaging assembly of claim 1 further comprising:

a plurality of vias disposed on and penetrating through said carrier substrate; and a plurality of package leads, each connected to one of said wire bonding pads for connecting through said vias to an external connection means disposed on a second surface on said carrier substrate opposite said die attachment surface.

3. The electronic device packaging assembly of claim 2 further comprises:

a low voltage layer and a high voltage layer for connecting to one of said consolidated common voltage connection means; and said consolidated common voltage connection means includes a consolidated low voltage connection means for connecting to said low voltage layer and a consolidated high voltage connection means for connecting to said high voltage layer.

4. The electronic device packaging assembly of claim 3 wherein:

said external connection means disposed on said second surface is a ball grid array including a plurality of solder balls attached thereon.

5. The electronic device packaging assembly of claim 4 wherein:

said consolidated low voltage connection means is a ground voltage bar and said low voltage layer is a ground voltage layer; and said consolidated high voltage connection means is a Vcc-power voltage bar and said high voltage layer is a Vcc-power voltage layer.

6. An electronic device including an integrated circuit (IC) component mounted on a die attachment surface supported by a carrier substrate in a packaging assembly, said electronic device comprising:

a plurality of wire bonding pads formed on said carrier substrate each of said bonding pads is electrically connected to said IC component with a pad bonding wire;

a plurality of vias disposed on and penetrating through said carrier substrate;

a plurality of package leads formed on said substrate carrier, each connected to one of said wire bonding pads for connecting through said vias to an external connection means disposed on a second surface on said carrier substrate opposite said die attachment surface; and at least one consolidated common voltage connection means disposed on said die-attachment surface, on a same surface as said wire bonding pads, provided for electrically connecting to said electronic device with a plurality of common voltage bonding wires for establishing a common voltage connection for said electronic device wherein said consolidated common voltage connection means being disposed on a same plane as said die attachment surface directly adjacent to and spaced from said electronic device whereby said common voltage bonding wires are shorter than said pad bonding wires and said common voltage connecting means is provided with a freedom for connecting to different levels of common voltages.

7. The electronic device of claim 6 wherein:

said consolidated common voltage connection means disposed on said same plane as said die attachment surface directly adjacent to and spaced from said electronic device including at least a common voltage bar for electrically connecting to said electronic device with a plurality of common voltage bonding wires.

8. The electronic device of claim 7 further comprises:

a low voltage layer and a high voltage layer for connecting to one of said consolidated common voltage connection means; and said consolidated common voltage connection means includes a consolidated low voltage connection means for connecting to said low voltage layer and a consolidated high voltage connection means for connecting to said high voltage layer.

9. The electronic device of claim 8 wherein:

said external connection means disposed on said second surface is a ball grid array including a plurality of solder balls attached thereon.

10. The electronic device of claim 9 wherein:

said consolidated low voltage connection means is a ground voltage bar and said low voltage layer is a ground voltage layer; and said consolidated high voltage connection means is a Vcc-power voltage bar and said high voltage layer is a Vcc-power voltage layer.

* * * * *